United States Patent

[11] 3,573,469

[72] Inventor Richard P. Riesz
Chathan, N.J.
[21] Appl. No. 776,220
[22] Filed Nov. 15, 1968
[45] Patented Apr. 6, 1971
[73] Assignee Bell Telephone Laboratories, Inc.
Murray Hill, Berkeley Heights, N.J.

[54] OPTICALLY CONTROLLED PHASE ADJUSTMENT FOR ELECTRICAL SIGNALS
12 Claims, 3 Drawing Figs.

[52] U.S. Cl. ........................................................ 250/211,
317/235, 307/311, 331/107
[51] Int. Cl. ........................................................ H01l 15/00,
H03k 3/26
[50] Field of Search ............................................ 250/211;
317/235—27; 331/167, 94.5; 307/311, 312, 232, 262, 278, 295; 333/29

[56] References Cited

UNITED STATES PATENTS 3,437,954 4/1969 Herniott et al. ................ 331/94.5
3,439,290 4/1969 Shinoda ........................ 331/107
3,440,425 4/1969 Hutson et al. .................. 317/235X

OTHER REFERENCES

Northrop et al; Solid State Electronics; Vol. 7; No. 1; Jan. - 1964, pp 17— 30; (TK 7800— 558)
Ridley et al.; Journal of Physics & Chemistry of Solids; Vol. 26; No. 1; Jan. 1965; pp 21— 31 (QC 176 — p4)

*Primary Examiner*—Walter Stolwein
*Attorneys*—R. J. Guenther and Kenneth B. Hamlin

ABSTRACT: A semiconductor device of the type which nucleates and propagates high intensity electric field domains in response to the application of an electric field across the device is illuminated at a part of the device where such domains are nucleated and with sufficient energy density to alter the phase relationship of the propagated domains with respect to the applied electric field. Such a device is employed for gating pulses of electromagnetic energy through an electro-optical modulator to an optical delay line for reentering digital information in the delay line as it is coupled from the output of such line.

INVENTOR
R. P. RIESZ
BY
Charles Scott Phelan
ATTORNEY

OPTICALLY CONTROLLED PHASE ADJUSTMENT FOR ELECTRICAL SIGNALS

BACKGROUND OF THE INVENTION

1. Field of the Invention

This invention relates to electromagnetic energy-sensitive solid-state devices, and it relates in particular to such a device which is responsive to incident light for adjusting the phase of an electric signal produced by the device.

2. Description of the Prior Art

Semiconductor devices which are responsive to the application of an electric field for nucleating and propagating high-intensity electric field domains through the device in the direction of the field are now known in the art and are sometimes identified as Gunn effect, or two-valley, devices. These devices are characterized by electric current conduction by means of carriers which exist in the device in two energy bands which are energetically separated. In the absence of an applied electric field, the carrier concentration and mobility in the lower energy band are much higher than the carrier concentration and mobility in the upper energy band. An applied electric field transfers electrons to the upper band, or valley; and, if the field is at least as large as a threshold of about several thousand volts per centimeter for samples less than about 0.2 millimeters in length, coherent oscillations result with a period close to that needed for carriers to drift through the device. The oscillations represent the domains passing successively through the device; and the domains travel at a velocity such as $10^7$ centimeters per second, or about one and one-half orders of magnitude faster than the speed of sound. The portion of such a device in which domains are nucleated is sometimes identified as the cathode area of the device, while the portion on the opposite side of such device in the direction of the applied electric field is identified as the anode area.

Semiconductor devices of the type just described and having a wafer configuration are known to be responsive in a frequency sense to illumination. As a band of light is moved along such a device in the direction of the applied electric field the output signal oscillation repetition frequency varies as a function of the distance between the device anode area and the position of the illumination band. The so-called Gunn effect devices are also known to function as electro-optic modulators for modulating a transmitted light beam in accordance with variations of the applied electric field.

SUMMARY OF THE INVENTION

In accordance with the present invention, it has been discovered that semiconductor devices of the Gunn effect type respond to illumination of a predetermined minimum intensity which is incident upon the cathode area of the device by shifting the phase of the electric field domains nucleated in the device with respect to the phase of the applied electric field.

It is one feature of the invention that light in the absorption band of the semiconductor device is useful for shifting the phase of nucleated domains.

It is another feature that the light impinges upon only a small part of the surface of the device in a direction which is generally perpendicular to the direction of the applied electric field.

BRIEF DESCRIPTION OF THE DRAWING

A more complete understanding of the invention may be obtained from a consideration of the following detailed description when taken in connection with the appended claims and the attached drawing in which:

DETAILED DESCRIPTION

Figure 1:
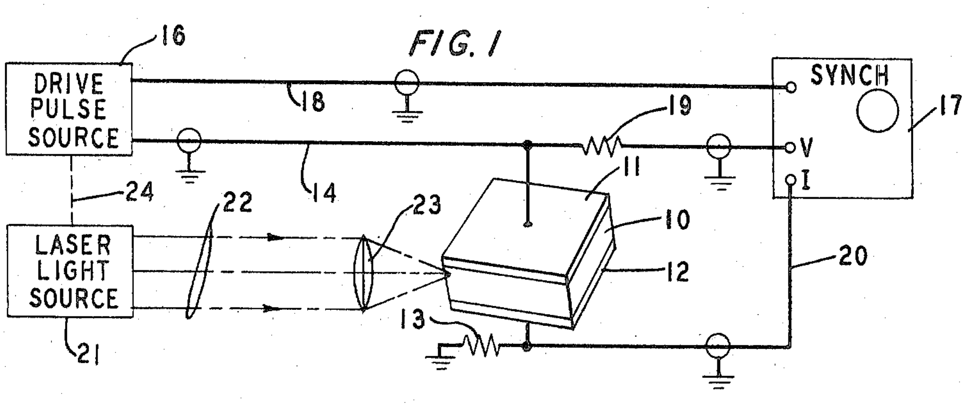
FIG. 1 is a schematic diagram of an experimental arrangement for demonstrating the phase adjustment capability of a semiconductor device in accordance with the present invention.

In FIG. 1 a semiconductor device such as a gallium arsenide crystal 10 has an electric field applied thereacross through alloyed ohmic contacts 11 and 12. The device 10 is of the type hereinbefore described which is responsive to an applied electric field of a predetermined threshold magnitude for nucleating high intensity electric field domains in the area of the cathode contact 11 and propagating such domains through the device 10 to the area of the anode contact 12 wherein the domains are extinguished. In the absence of such a high field intensity domain in the device 11, the device presents a comparatively low resistance to the transmission of electric current between the contacts 11 and 12. Consequently, a comparatively high current flows through the device and through a load resistor 13 which is connected in series with the device 10 between ground and one output shielded circuit 14 of a drive pulse source 16. However, when a domain is present in the device 10, the device presents a comparatively high resistance to the flow of electric current and a much lower current flows through the resistor 13 at those times.

Figure 2:
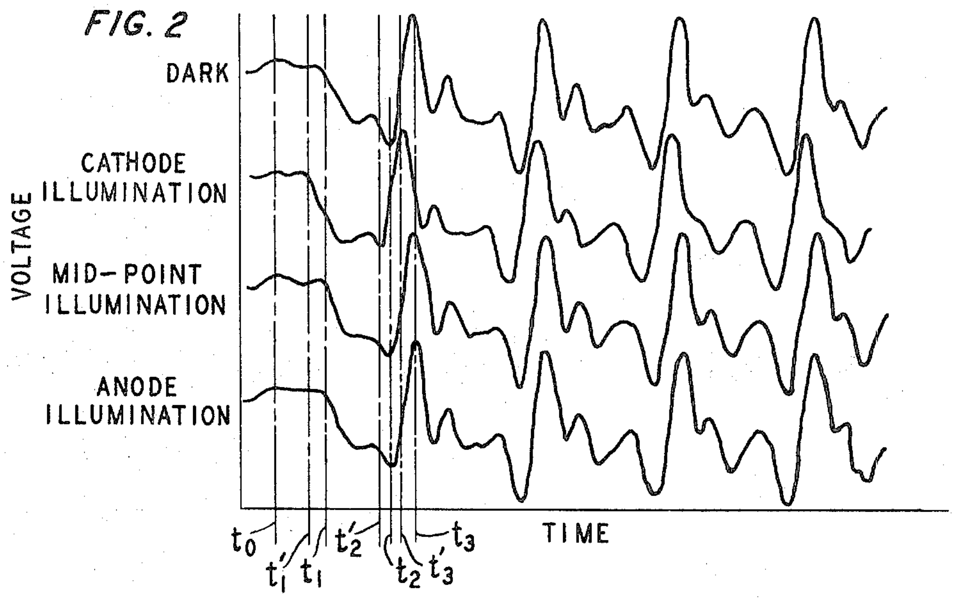
FIG. 2 is a family of curves of voltage versus time for illustrating the operation of the experimental arrangement in FIG. 1.

In order to demonstrate the phase shifting capabilities of the device 10 pulsed direct current is applied to the device from the pulse source 16. Such direct current pulses recur at a low frequency. The amplitude of each pulse is, however, at least equal to the voltage amplitude which is required across device 10 for nucleating electric field domains in the fashion of the known Gunn effect devices. In order to observe the effects, a dual trace oscilloscope 17 is advantageously operated in synchronism with the device 10 by means of a second pulse output shielded circuit 18 from the source 16 to the synchronizing input of the oscilloscope 17. A resistor 19 is coupled through shielded connections from circuit 14 to one deflection input V of the oscilloscope 17. Another shielded circuit 20 couples the anode contact 12 of the device 10 to a second deflection input I of the oscilloscope 17. With this arrangement the oscilloscope presents simultaneously traces of the voltage drops across the device 10 and across the resistor 13 in synchronism with the output of the drive pulse source 16. The voltages across resistor 13 are convenient for demonstrating operation of the device 10, and corresponding traces are illustrated in FIG. 2.

When the device 10 is in its dark state, that is, when it lacks the localized illumination which will be subsequently described, it responds in the fashion illustrated by the Dark wave trace of voltage versus time in FIG. 2. Thus, when a pulse from source 16 exceeds in amplitude the Gunn effect threshold of device 10, a domain is nucleated therein in the area of the cathode contact 11 and propagated through the device in the direction of the applied electric field to the area of the anode contact 12. Considering FIG. 2, each voltage trace represents the time interval corresponding to the leading part of the top of a pulse from source 16. At a time $t_0$ the applied electric field which was initiated at a prior time is going through the transition from leading edge to pulse top and simultaneously attains the Gunn effect threshold of the device 10. During that brief transition the drive pulse slope is decreasing.

Shortly thereafter at time $t_1$ a high intensity electric field domain is forming in the device and the device resistance is increasing. The potential difference across the resistor 13 begins to decrease as illustrated in FIG. 2, thereby reflecting the initial reduction in current therethrough. The complete formation of the domain and its propagation through the device 10 causes further increase in the dark voltage with corresponding decrease in the voltage across resistor 13, as indicated in FIG. 2.

At time $t_2$ the current through, and the potential difference across, resistor 13 reach a minimum; and shortly thereafter the domain is extinguished. A low resistance state is thereby assumed in device 10 and permits the current and the potential difference in resistor 13 to rise sharply as indicated at the time $t_3$. Under these conditions another high intensity electric field domain is formed and propagates through the device 10 in the same fashion. This repeated formation, propagation, and extinction of domains continues for the duration of the pulse from source 16. That pulse subsequently terminates at a time not shown in FIG. 2 and thereby prevents the device 10 from producing further domains.

In accordance with one aspect of the present invention a light source 21 provides a beam 22 of electromagnetic energy which is focused by a condensing lens 23 on to a small area of the device 10 between contacts 11 and 12, and in the vicinity of the contact cathode 11. Source 21 is advantageously a helium-neon laser since the wavelength of the output of such a laser is known to lie in the absorption band of the gallium arsenide material employed in the device 10. With this type of illumination, the operation of the device 10 was modified as indicated by the Cathode Illumination trace in FIG. 2. In that trace it can be seen that at a time $t'_1$, which is significantly in advance of the time $t_1$, the voltage across resistor 13 begins to decrease rapidly, indicating the formation of a high intensity electric field domain. A minimum potential difference in the Cathode Illumination trace occurs at time $t'_2$, which is in advance of the time $t_2$ by a similar time interval. Likewise the immediately following peak in the Cathode Illumination trace, indicating extinguishment of the domain, occurs at time $t'_3$ just prior to the aforementioned time $t_3$.

It can be seen by comparing the Dark voltage trace and the Cathode Illumination trace in FIG. 2 that the formation of domains continues at the same frequency and in substantially the same configuration for as long as the pulse from the source 16 is applied. However, the portion of the Cathode Illumination trace from the time of the initial break in the potential difference across the resistor 13 onward is advanced in phase uniformly by the interval $t'_1$ to $t_1$. In other words, the initial domain formed upon application of the electric field is formed earlier, but subsequent domains formed during the same field pulse do not experience a similar advance with respect to each other though they do experience the same advance with respect to the Dark trace. A phase advance is thereby achieved without a corresponding change in frequency. Thus, the localized illumination supplements the effect of the applied electric field to form the domains at an earlier time without changing the oscillation period. In a time sense the illumination is advantageously selectively applied to overlap all or any part of an electric pulse as appropriate for a particular application and as schematically represented by a synchronizing connection 24 between sources 16 and 21. For purposes of the present discussion the illumination is applied to overlap the leading edge of the electric pulse.

Beam 22 was displaced from the area of the cathode contact 11 along the device 10 toward the anode contact 12, and the phase shift effect disappeared. This can be seen in FIG. 2 from the fact that a voltage trace for Midpoint Illumination and another trace for Anode Illumination are in substantial phase agreement with the Dark voltage trace and are both delayed in phase with respect to the Cathode Illumination trace. It was further found that, as long as the beam 22 impinged upon the device 10 in the area of the contact 11, the point of incidence was not critical; and the same effect was produced at any point around the perimeter of the device 10 but adjacent to the cathode contact 11. However, if the point of beam incidence on the device 10 was moved along the device toward the anode by a distance corresponding approximately to the diameter of the spot of incidence in one embodiment, the phase shift effect disappeared.

In a somewhat modified extension of the experiment hereinbefore described, the intensity of beam 22 was adjusted by means which are well known in the art but which are not shown in the drawing because they comprise no part of the present invention. It was found that as the intensity, or energy density, of illumination was thus increased from dark level toward higher intensities, the previously described phase shift effect was not at first produced. However, when the intensity exceeded a certain threshold level for the device 10, the indicated phase shift occurred in a stepwise fashion with no intermediate phase shift conditions. Thereafter, as the intensity of illumination was further increased, the phase shift realized on each drive pulse remained the same as illustrated in FIG. 2. The phase shift function was thus bimodal in the manner of a phase switch.

In one arrangement which was actually employed, the gallium arsenide crystal was 50 microns long in the direction between contacts 11 and 12 and 250 microns in each of the other two dimensions. N-type gallium arsenide with a resistivity in the range 0.1 through 10 ohms-centimeters was preferably employed. The material had a carrier concentration of more than $10^{12}$ per square centimeter. The output of the light source 21 had a wavelength of 6328 A and was focused to a spot of about 10 microns in diameter on the side of the sample 10. In the illustrated embodiment the phase shift threshold was at an intensity of the order of $10^3$ watts per square centimeter, and intensities up to about $10^4$ watts per square centimeter produced no further phase shift.

Figure 3:
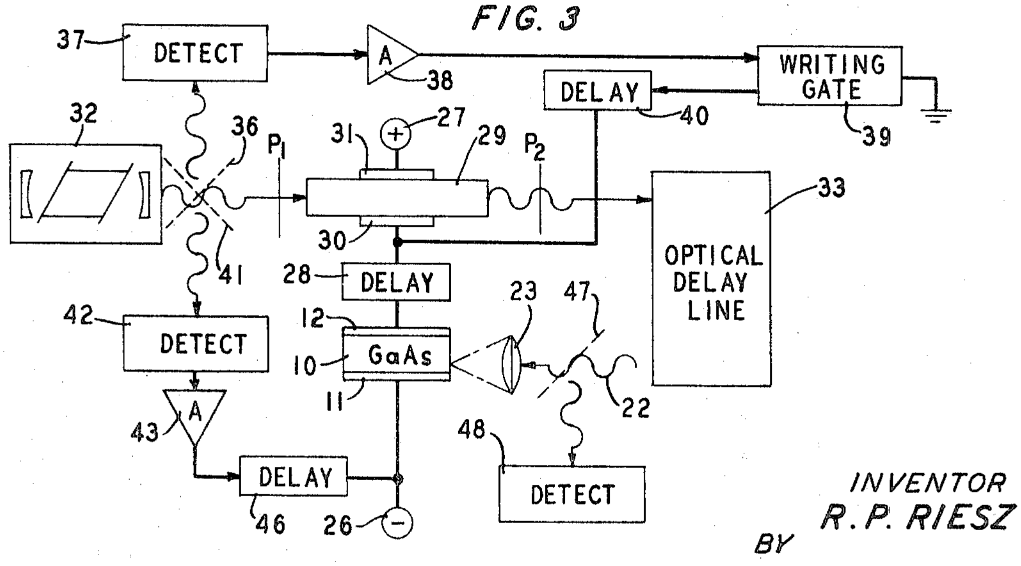
FIG. 3 is a simplified schematic diagram of an optical dynamic storage system utilizing the invention.

FIG. 3 shows a simplified diagram of a dynamic store which utilizes an optical delay line of a type now known in the art. An example of such a delay line is to be found in the copending application of D. R. Herriott and H. J. Schulte, Jr., Ser. No. 444,307, filed Mar. 31, 1965, and entitled "Optical Devices," now U.S. Pat. No. 3,437,954. An example of the type of dynamic store indicated is further described in the IEEE Journal of Quantum Electronics, Jun. 1967, page 246, in a digest of a technical paper Number 6–3 entitled "Optical Delay Line Memory" by H. J. Schulte and A. J. Rack. The latter store operated at a 100 megahertz bit rate. Only key aspects of that type of a store which are necessary for illustrating one application of the present invention are illustrated in FIG. 3. A phase switch of the type hereinbefore described is employed in the store for controlling the recirculation of binary coded information through the dynamic loop of the store. Insofar as circuit elements in FIG. 3 are similar to those employed in FIG. 1 corresponding reference characters are utilized in FIG. 3.

A negative source 26 and a positive source 27 provide direct-current bias to a series circuit combination including the gallium arsenide crystal device 10, an electric delay circuit 28, and an electro-optical modulator 29 which is positioned between electric circuit contacts 30 and 31. Delay circuit 28 and other similar circuits to be mentioned are of a type known in the art for producing selectable partial period delays at the pulse repetition rate of the store system. Sources 26 and 27 are schematically represented by circled polarity signs indicating a particular terminal of any suitable potential source which has the terminal of the indicated polarity connected in the circuit at the circled polarity sign, and which has its terminal of opposite polarity connected to ground.

The electro-optical modulator 29 is preferably an elongated crystal of lithium niobate which is known in the art to respond to an applied electric field for altering the polarization orientation of monochromatic light transmitted through the crystal in a direction which is perpendicular to the applied field. The monochromatic light is supplied advantageously by a mode locked helium-neon laser 32 which has its output directed for transmission through a polarizer P1, the modulator 29, and an analyzer P2 to an input of an optical delay line 33. The polarizer and analyzer are oriented with respect to the output of laser 32 and the modulator 29 so that light is coupled from the laser 32 to the input of the optical delay line if an electric field of appropriate minimum magnitude is being applied between the contacts 30 and 31.

A first mirror system 36 diverts part of the output of the laser 32 to a photodetector 37 which has its output in turn coupled through an amplifier 38 to an input of a writing gate 39. Photodetector 37 and other similar devices used in FIG. 3 are advantageously fast diodes such as those considered in "Schottky Barrier Photodiodes with Antireflection Coating"

by M. C. Schneider, pages 1611—1638 of The Bell System Technical Journal, Vol. XLV, No. 9, Nov. 1966. Gate 39 is advantageously controlled by external means, well known in the art and not shown herein, for gating signals to the output of gate 39 in accordance with predetermined binary coded information. Gate 39 is, of course, operated only when it is desired to write in new information, and at other times it is disabled while stored information is recirculated through line 33. The output of gate 39 is coupled through a delay circuit 40 to contact 30 of the modulator 29 and returns through the modulator, positive source 27, and ground to the gate 39. Delay 40 is adjusted so that each information bit from the writing gate 39 is applied to the modulator 29 in coincidence with an output pulse from the laser 32. Such writing pulses have amplitudes which are appropriate to produce in the modulator 29 polarization rotations corresponding to the aforementioned information. Thus, the information gated through the writing gate 39 is modulated on to the output of laser 32 and inserted in optical delay line 33.

As previously noted, the gallium arsenide phase switch device 10 is employed for controlling the recirculation through delay line 33 of information stored therein. In order to maintain synchronism with output pulses from laser 32, a second mirror system 41 diverts a portion of the laser output to another photodetector 42. Electric signal output from that detector is applied through an amplifier 43 and a delay circuit 46 to the device 10 at the contact 11 thereof. The delay of the delay circuit 46 is adjusted to cause pulses which are applied to device 10 to be in synchronism with output light pulses from the delay line 33 which are coupled in the beam 22 through the condensing lens 23 to a spot on the side of the device 10 at cathode 11.

Pulses applied to the device 10 from the delay circuit 46 complement the aforementioned direct-current bias for raising the total applied bias on the device to a level which exceeds the Gunn effect threshold so that a high intensity electric field domain is produced in the device 10 and propagated therethrough as described. However, each electric pulse is advantageously time limited to produce only one domain. Furthermore, the illustrated circuits of device 10 are advantageously configured or otherwise tuned to cause device 10 to respond at a Gunn oscillation rate which is slightly less than the pulse rate from laser source 32 to help maintain the pulse-for-pulse operation. Since each such electric pulse is in synchronism with the output of delay line 33, the correspondingly nucleated domains in the device 10 are advanced in phase each time such an electric pulse coincides with a light pulse. If there is no such coincidence, there is no domain phase switch, and domains are nucleated at a relatively delayed phase.

The delay of delay circuit 28 is fixed to correspond to the known delay which can be produced in the device 10. Thus, in the absence of coincidence between an electric pulse from delay 46 and a light pulse from delay line 33, the electric pulse is coupled through the device 10 and the delay 28 to arrive at modulator 29 at a time interval between output light pulses from laser 32 so that such light pulses do not reach the optical delay line 33. However, if a light pulse is applied to device 10 in coincidence with an electric pulse from delay 46, the phase shift of the device 10 and the delay circuit 28 complement, or offset, one another as may be required for a particular delay line 33 so that the resulting output of delay circuit 28 is applied to modulator 29 in coincidence with a light pulse from laser 32. The latter pulse is then coupled through the optical system to the input of the delay line 33.

A third mirror system 47 diverts a portion of the output of optical delay line 33 to a photodetector 48 for nondestructive readout of the illustrated store system.

Although the present invention has been described in connection with particular embodiments thereof, it will be understood that additional embodiments and modifications which are obvious to those skilled in the art are included within the spirit and scope of the invention.

I claim:

1. In combination, a body of semiconductor material which is responsive to the application of an electric field for nucleating electric field domains and propagating said domains through said body at a velocity much greater than the speed of sound, in the direction of said field, and in a predetermined phase relationship with respect to said field, means applying said electric field to said body, and means illuminating a part of said body at which said domains are nucleated and with at least a predetermined threshold energy density which is sufficient to shift the phase of said domains.

2. In combination, a body of semiconductor material in which conduction by carriers can take place in two energy bands that are energetically separated, the carrier concentration and mobility in the lower energy band in the absence of electric fields being much higher than the carrier concentration and mobility in the upper energy band, the carriers being shiftable to said upper band by an applied electric field, means applying an electric field to said body to shift carriers to said upper energy band for establishing, in the absence of illumination, traveling domains of high electric field intensity within said body and which travel in the direction of said field, and means illuminating a part of said body at which said domains are nucleated with at least a predetermined threshold energy density which is sufficient to switch the phase of nucleation of said domains at said part from a first substantially uniform phase for densities below said threshold to a second substantially uniform phase for densities above said threshold.

3. In combination, a body of semiconductor material which is responsive to the application of an electric field for nucleating electric field domains and propagating said domains through said body at a velocity much greater than the speed of sound, in the direction of said field, to produce coherent oscillations in a predetermined phase relationship with respect to said field, means applying said electric field to said body, and means illuminating a part of said body at which said domains are nucleated and in synchronism with the application of said electric field to cooperate with said field for altering the phase, at substantially no change in frequency, of the nucleation of said domains.

4. The combination in accordance with claim 3 in which said illuminating means comprises means applying a beam of electromagnetic energy containing energy in the absorption frequency band of said body.

5. The combination in accordance with claim 4 in which said part of said body upon which said beam of electromagnetic energy impinges has a diameter which is much less than any external dimension of said body.

6. The combination in accordance with claim 3 in which said body has width and height dimensions of similar magnitude, both of which are much larger than the length dimension of said body, and said electric field is applied along said length dimension.

7. The combination in accordance with claim 3 in which said illuminating means includes means initiating the illumination at a time which precedes and overlaps a time at which said electric field attains a threshold for nucleation of said domains.

8. The combination in accordance with claim 3 in which means are provided to indicate the presence of said domains in said body.

9. The combination in accordance with claim 8 in which said indicating means comprises an optical delay line and an electro-optical modulator for coupling a train of light pulses to said delay line, and said illuminating means comprises an optical system coupling the output of said delay line to said part of said body for shifting the phase of said domains into time synchronism with said light pulses at said modulator.

10. The combination in accordance with claim 3 in which said material is N-type gallium arsenide, and said illuminating means applies an illumination intensity on said part of said body of at least $10^3$ watts per square centimeter.

11. The combination in accordance with claim 3 in which said material has an illumination intensity threshold such that operation of said illuminating means at intensities in a range below said threshold at said part causes said domains to have said predetermined phase relationship but operation at intensities in a range above said threshold causes said domains to have a second phase relationship with respect to said field, said domains occurring at approximately the same frequency in both of said ranges, and means actuating said illuminating means to operate in different selectable ones of said intensity ranges.

12. The combination in accordance with claim 5 in which said material is N-type gallium arsenide, said material has an illumination intensity threshold such that operation of said illuminating means at intensities in a range below said threshold at said part causes said domains to have said predetermined phase relationship but operation at intensities in a range above said threshold causes said domains to have a second more advanced phase relationship with respect to said field, said domains occurring at approximately the same frequency in both of said ranges, and means actuating said illuminating means to operate in different selectable ones of said intensity ranges.